United States Patent [19]

Cheng

[11] Patent Number: 5,247,209
[45] Date of Patent: Sep. 21, 1993

[54] SUPPLY INDEPENDENT CONSTANT OUTPUT CIRCUIT HAVING FAST STABILIZATION

[75] Inventor: Chia-Lin Cheng, Taoyuen, Taiwan
[73] Assignee: Acer Incorporated, Taipei, Taiwan
[21] Appl. No.: 881,626
[22] Filed: May 12, 1992
[51] Int. Cl.[5] .................. H03K 3/013; H03K 17/16
[52] U.S. Cl. ........................... 307/296.5; 307/296.4; 307/296.6; 307/296.8; 307/272.3
[58] Field of Search ............... 307/272.2, 272.3, 296.1, 307/296.4, 296.5, 296.6, 296.8, 572; 323/313, 314

[56] References Cited

U.S. PATENT DOCUMENTS

| | | | |
|---|---|---|---|
| 4,096,430 | 6/1978 | Waldron | 307/296.8 |
| 4,585,955 | 4/1986 | Uchida | 307/296.8 |
| 4,808,860 | 2/1989 | Labrousse et al. | 307/572 |
| 4,943,945 | 7/1990 | Lai | 365/189.09 |
| 4,948,995 | 8/1990 | Takahashi | 307/594 |
| 5,089,728 | 2/1992 | Nguyen | 307/572 |
| 5,172,012 | 12/1992 | Ueda | 307/272.3 |

Primary Examiner—William L. Sikes
Assistant Examiner—Terry D. Cunningham
Attorney, Agent, or Firm—Kenneth M. Kaslow

[57] ABSTRACT

A constant output circuit wherein outputs are not a function of deviations of reference voltage. More specifically, the outputs maintain their logic "1" and logic "0" values, even when there are reference voltage noise or fluctuation in the circuit. This constant output circuit having a logic "1" output node and a logic "0" output node comprises a first PMOS transistor, a second PMOS transistor, and a first NMOS transistor. A logical inversion operation is performed between a first input node and a first output node of a logic circuit. The first input node is coupled to the logic "1" output node. The gate of said first PMOS transistor is coupled to the first output node of the logic circuit, the source to the power supply, and the drain to said logic "1" output node. The gate of said second PMOS transistor is coupled to the logic "1" output node, the source to the power supply, and the drain to said logic "1" output node. The gate of said first NMOS transistor is coupled to said logic "1" output node, the source to the ground, and the drain to said logic "0" output node. With this circuit design, the output values of logic "0" and logic "1" will not be affected by noises of the ground or the power supply of the circuit.

10 Claims, 4 Drawing Sheets

SUPPLY INDEPENDENT CONSTANT OUTPUT CIRCUIT HAVING FAST STABILIZATION

BACKGROUND OF THE INVENTION

1. Field of Invention

The present invention relates generally to a constant output circuit and specifically to a constant output circuit employed in an integrated circuit.

2. Description of Related Art

In Very Large Scale Integration (VLSI) chip design, certain inputs of a standard cell must be connected to a fixed-value node such as power source (logic 1) and ground (logic 0). For instance, if there are only two input signals present in a three-input NAND gate standard cell design, then the third input node needs to be preprocessed. The preprocessing can be accomplished for example, by connecting the third input to the power supply through a pull-up resistor. This example shows one of the cases that an integrated circuit designer often needs to have steady and reliable source for logic "1" and logic "0".

A circuit designer can simply use the power supply and the ground for logic "1" and logic "0" by connecting the circuit to VDD and GND respectively. Since the voltage of the power supply or the ground may deviate within a range, the VLSI chip designer often uses a constant output circuit to provide a reliable logic "1" or logic "0".

FIG. 1 is a circuit diagram of a conventional design. As shown in FIG. 1, a conventional constant output circuit comprises an inverter gate 11 and a NAND gate 12. The output 121 of NAND gate 12 is coupled to the input of inverter gate 11 and NAND gate 12; the output 111 is coupled to the other input of NAND gate 12. Output 121 of this circuit is of logic "1" and output 111 is of logic "0".

When there are noises in ground (GND) and power supply (VDD), error may occur in inverter gate 11. As a result, output 121 erroneously has a logic "0" and input 111 a logic "1". More errors may begin to occur from then on in the downstream circuits. Although the output value of the above circuit may correct itself, yet it takes up quite a long delay time, approximately 14 nanosecond (NS). FIG. 2 is a timing diagram that depicts the variation of outputs 111, 121 from incorrect output values to correct output values. The shortcoming of the above conventional constant output circuit results from the fact that the logic "1" output has both the path to the power supply (VDD) and the path to the ground (GND). Similarly, the logic "0" output has path to the power supply (VDD) and also the path to the ground (GND). Unstable voltage of the power supply or the ground may introduce error outputs of inverting gate 11, and then error output of signals 111, 121 may result.

The present invention can solve this problem by incorporating a stable constant output circuit in the circuit design. High reliability is a major feature of this invention. Since the logic "0" output does not have path to the power supply (VDD) and the logic "1" output does not have path to the ground (GND), errors resulted from the unstable voltage of the power supply or the ground will never occur in the invention.

The constant output circuit of the present invention also features a fast speed of reaching the stable state. Its operating speed is several times faster than that of the prior art.

SUMMARY OF THE INVENTION

The present invention relates to a constant output circuit having a logic "1" output terminal and a logic "0" output terminal, comprising a logic circuit, a first P-channel metal oxide semiconductor (PMOS) transistor, a second PMOS transistor and a first N-channel metal oxide semiconductor (NMOS) transistor. A logical inversion operation is performed between a first input node and a first output node of a logic circuit. The first input node is coupled to the logic "1" output node. The gate of said first PMOS transistor is coupled to the first output node of the logic circuit, the source to the power supply, and the drain to said logic "1" output node. The gate of said second PMOS transistor is coupled to the logic "1" output node, the source to the power supply, and the drain to said logic "1" output node. The gate of said first NMOS transistor is coupled to said logic "1" output node, the source to the ground, and the drain to said logic "0" output node. With this circuit design, the output values of logic "0" and logic "1" will not be affected by noises of the ground or the power supply of the circuit.

DETAILED DESCRIPTION OF THE PREFERRED EMBODIMENTS

Figure 3:
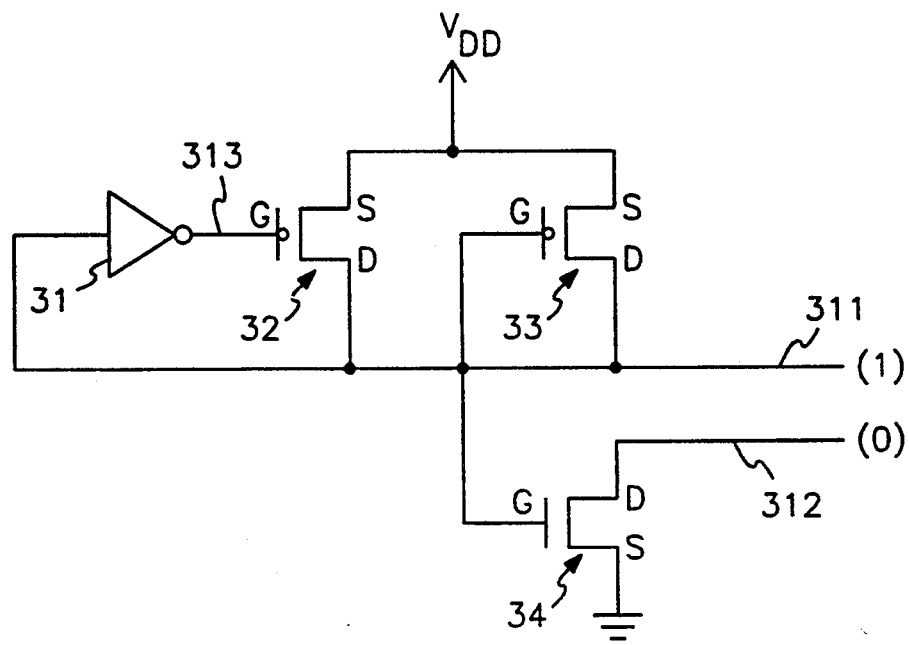
FIG. 3 is a circuit diagram of the first preferred embodiment of the present invention.

The present invention is described, by way of example, with reference to the first preferred embodiment as shown in FIG. 3. The invention comprises a logic "1" output 311 and a logic "0" output 312. The output circuit comprises a logic circuit 31, which has a first input node and a first output node 313 to perform a logical inversion operation, and the first input node is coupled to the logic "1" output node.

The invention comprises a first P-channel Metal Oxide Semiconductor (PMOS) transistor 32 with its gate coupled to the first output node 313. The source (S) of the first PMOS transistor 32 is coupled to the power supply (VDD), and the drain (D) is coupled to the logic "1" output node 311.

The invention also comprises a second PMOS transistor 33 with its gate coupled to the logic "1" output node 311. The source (S) of the second PMOS transistor 33 is coupled to the power supply (VDD), and the drain (D) is coupled to the logic "1" output node 311.

The invention also comprises a first N-channel Metal Oxide Semiconductor (NMOS) transistor 34 with its gate coupled to the logic "1" output node 311. The source (S) of the first NMOS 34 is coupled to the ground (GND), and the drain (D) is coupled to the logic "0" output node 312.

Figure 4:
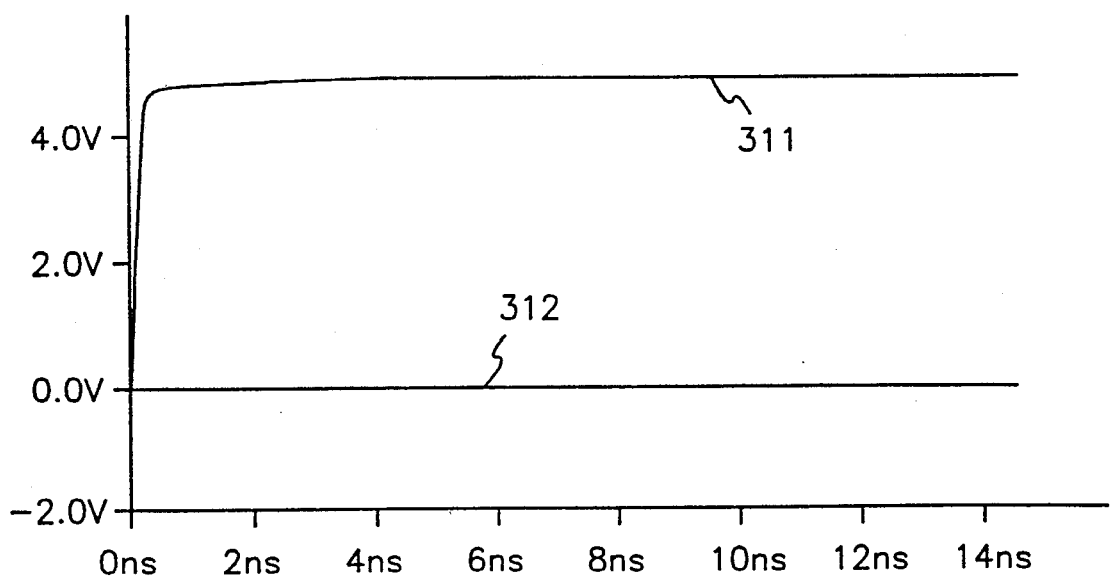
FIG. 4 is a wave diagram of FIG. 3 showing the variation of a normal initial value to a final correct output.

As shown in FIG. 3, when the circuit is working from the uncharged state, PMOS transistor 32 is off and PMOS transistor 33 is on. Power supply (VDD) gradually charges the output node 311 through PMOS transistor 33. After a period of time, the PMOS transistor 32 is on and the PMOS transistor 33 is off. Power supply (VDD) charges the output node 311 through PMOS transistor 32. Finally, output node 311 outputs a logic "1" and PMOS transistor 34 is on. During the whole process, output node 312 outputs the logic "0". Refer to FIG. 4 for the wave shape of the variation described above. FIG. 4 shows that output 311 reaches the stable state in just 1.8 nanosecond (NS).

As long as the circuit is in a stable state, even with unstable voltage occurring, at the power supply or the ground may switch the output 313 of the inversion logic circuit 31 from a logic "0" to a logic "1" and turn off PMOS transistor 32, it would not affect the output of the output nodes 311, 312. No matter how the power supply or the ground deviates after the circuit reaches a stable state, the output of the present invention will not change. And that is the main purpose of the present invention.

Figure 1:
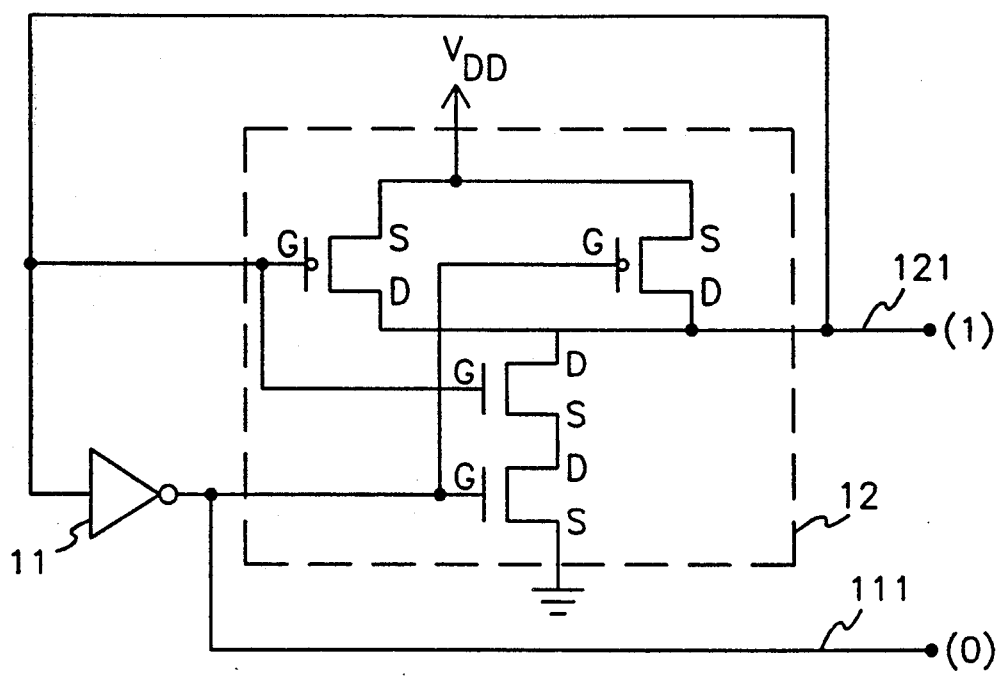
FIG. 1 is a circuit diagram of a prior art.
Figure 2:
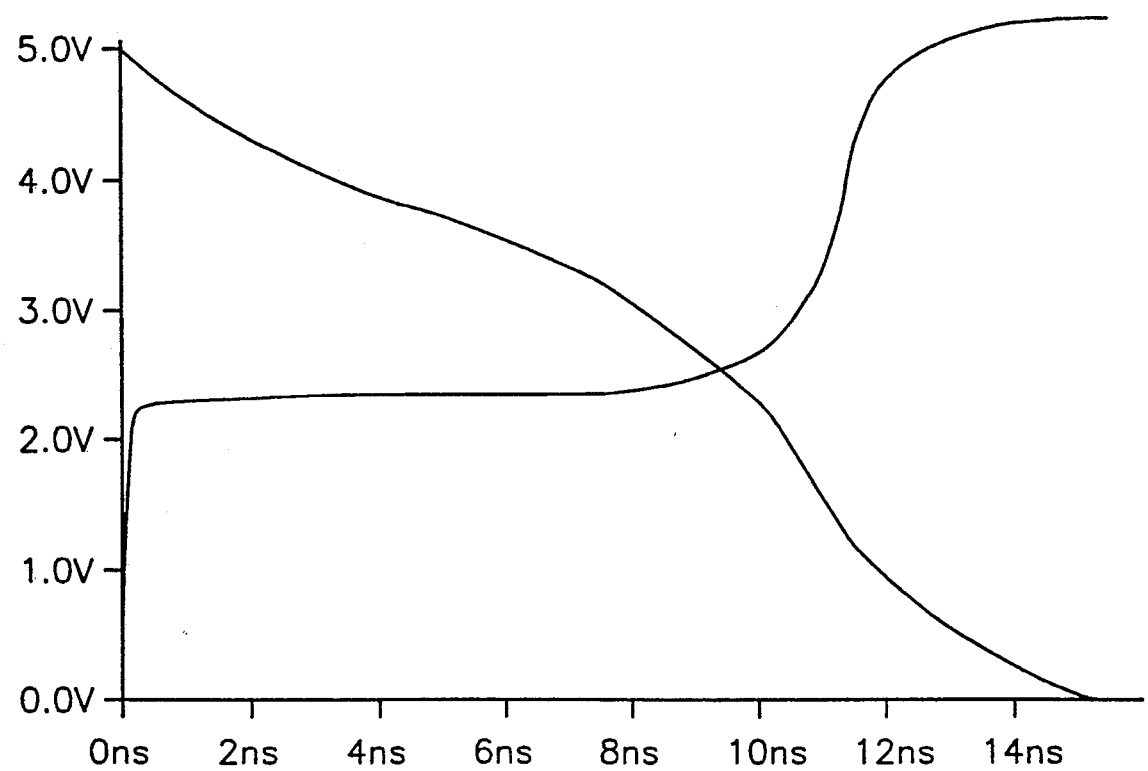
FIG. 2 is a wave diagram of the circuit of FIG. 1, illustrating the resumption of a correct output from an incorrect input.
Figure 5:
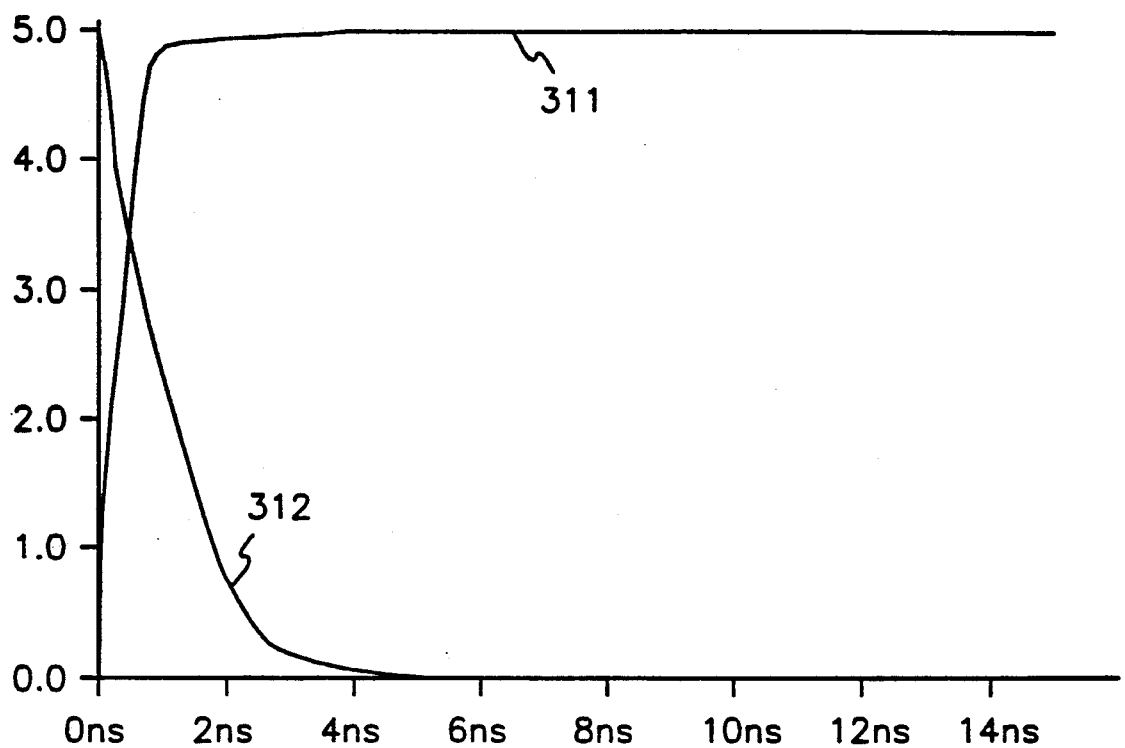
FIG. 5 is a wave diagram of FIG. 3 showing the variation of the output from an abnormal initial value to a final correct output.

Presumably, for an unknown and unexpected reason, the output 311 initially turns out to be a logic "0" and the output 312 a logic "1". The present invention will adjust itself by switching the value of output node 311 back to logic "1" and output node 312 to logic "0" after a certain amount of time. The circuit will then maintain these reliable output values as long as the power is on. The wave shape of the above adjustment is shown in FIG. 5. Comparing the resumption time shown in FIGS. 2 and 5 shows that the present invention takes less time to reach the stable state.

As shown in FIG. 5, it takes approximately 1 NS for output node 311, but 3 NS for output node 312 to reach the stable state. The second preferred embodiment illustrated by FIG. 6 can shorten the time of the transient state of the output node 312.

Figure 6:
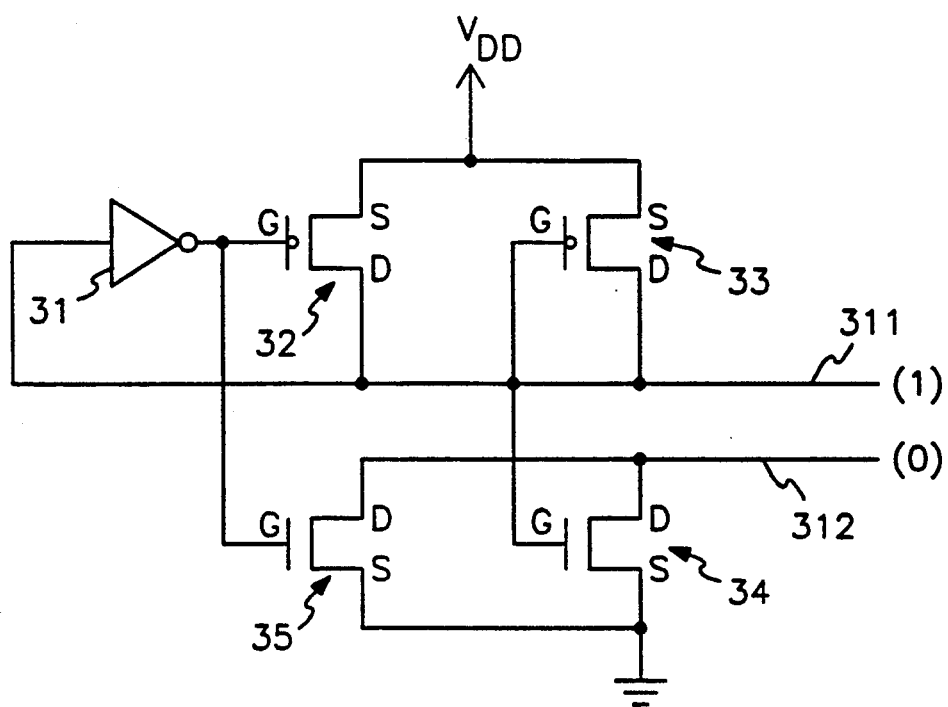
FIG. 6 is the second preferred embodiment of the present invention.

In FIG. 6, the second preferred embodiment further comprises a second NMOS transistor 35 with its gate coupled to the first output node 313. The source of NMOS transistor 35 is coupled to the ground, and the drain is coupled to the logic "0" output node 312. At least a NMOS transistor, either 34 or 35, will then be turned on at any time, and the ground will charge the output node 312. The output node 312 shown in FIG. 6 can reach a stable logic "0" much faster than the output node 312 shown in FIG. 3. And as long as the circuit reach the stable state, output will remain unchanged at any situation.

Figure 7:
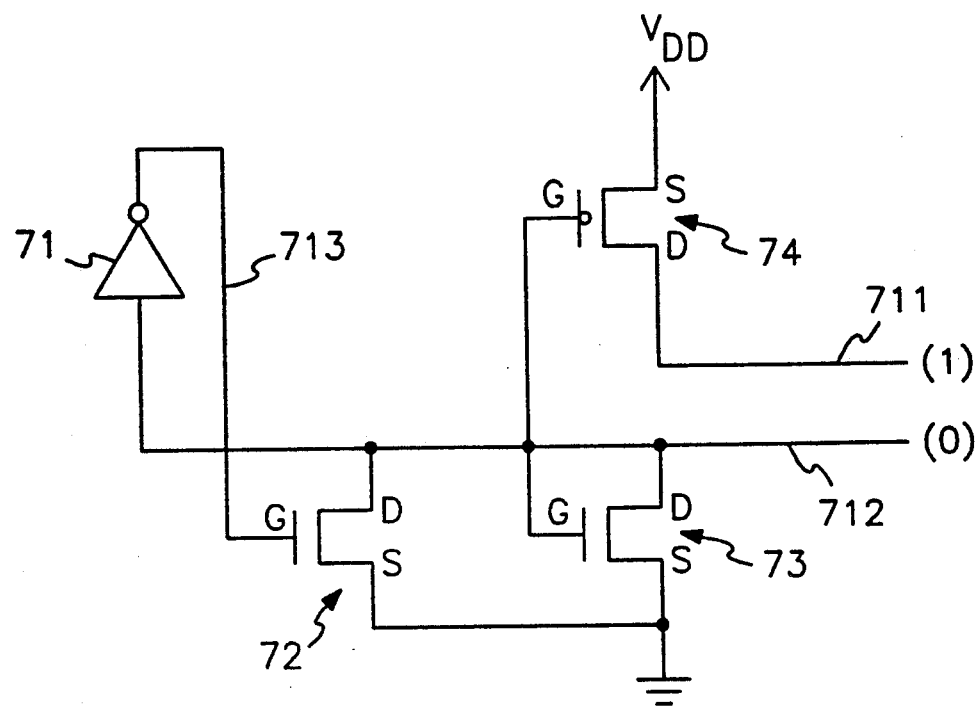
FIG. 7 is the third preferred embodiment of the present invention.

FIG. 7 illustrates the third embodiment of the present invention. In this embodiment, the circuit comprises a logic "1" output node 711 and a logic "0" output node 712. This output circuit comprises a logic circuit 71 having a first input node and a first output node 713 for a logical inversion operation. The first input node is coupled to the logic "0" output node 712.

This embodiment also comprises a first NMOS transistor 72 with its gate coupled to the output node 713. The source of the NMOS transistor 72 is coupled to the ground, and the drain is coupled to the logic "0" output node 712.

This embodiment also comprises a second NMOS transistor 73 with its gate coupled to the logic "0" output node 712. The source of NMOS transistor 73 is coupled to the ground, and the drain is coupled to the logic "0" output node 712.

This embodiment also comprises a first PMOS transistor 74 with its gate coupled to a logic "0" output node 712. The source of the PMOS transistor 74 is coupled to the power supply (VDD), and the drain is coupled to the logic "1" output node 711.

According to the operation analysis similar to that of FIG. 3, output node 711 and output node 712 in FIG. 7 constantly output the logic "1" and logic "0" respectively as long as the circuit is stable, even when there are fluctuations in the voltage of the power supply or the ground.

Figure 8:
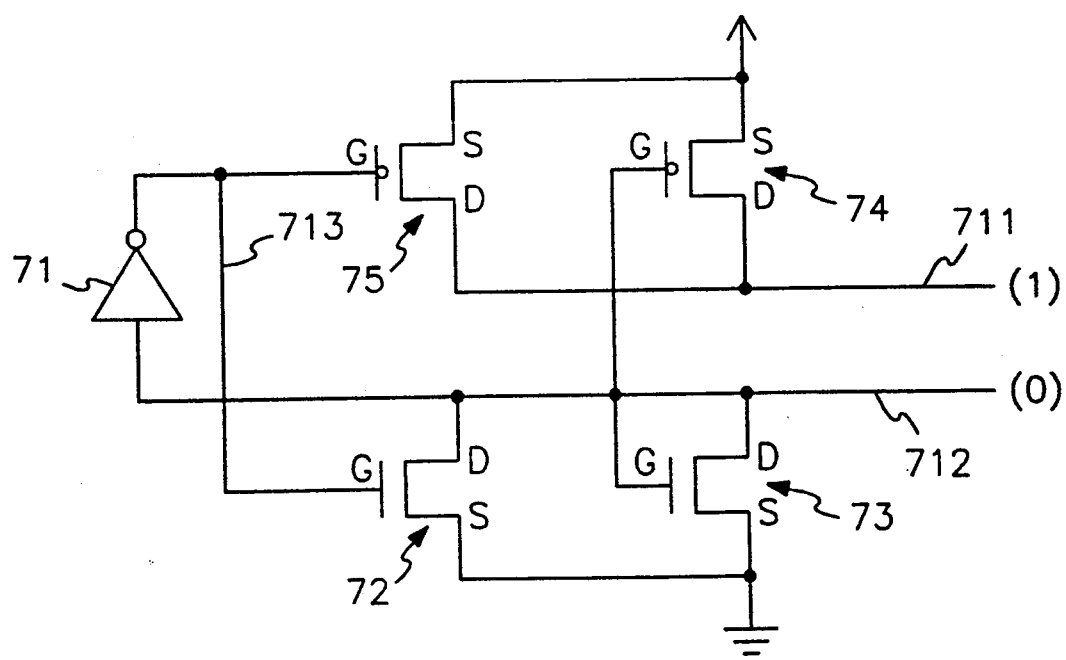
FIG. 8 is the fourth preferred embodiment of the present invention.

The fourth embodiment of the present invention illustrated in FIG. 8 is similar to the embodiment depicted by FIG. 6. The embodiment illustrated in FIG. 8 is derived from the embodiment illustrated in FIG. 7.

The fourth embodiment comprises a second PMOS transistor 75 with its gate coupled to the first output node 713. The source of PMOS transistor 75 is coupled to the power supply (VDD), and the drain is coupled to the logic "1" output node 711. At any time at least a PMOS transistor, either 74 or 75, is turned on, and the power supply will charge the output node 711. For this reason, the output node 711 shown in FIG. 8 can reach the stable logic "1" state faster than the output node 711 shown in FIG. 7. As long as the circuit is stable, the outputs 711, 712 will remain unchanged. Refer to the description of FIGS. 3 and 6 for the analysis on how the third and fourth preferred embodiments reach the stable state from the initial state to understand the operation of the FIGS. 7 and 8.

The logical inversion logic circuits 31, 71 may incorporate an inverter gate, which could be a NMOS inverter gate or a CMOS inverter gate.

Of course, many other modifications and substitutions to the foregoing detailed description of the four embodiments could be made without departing from the scope and spirit of the present invention. Thus, the foregoing description should be considered as merely illustrative of the present invention, and not in limitation thereof.

What is claimed is:

1. A constant output circuit having a logic "1" output node and a logic "0" output node, comprising:

a logic circuit having a first input node and a first output node for logical inversion operation, said first input node being coupled to said logic "1" output node;

a first P-channel metal oxide semiconductor (PMOS) transistor with a gate (G) coupled to said first output node, a source (S) coupled to a power supply (VDD), a drain (D) coupled to said logic "1" output node;

a second PMOS transistor with a gate coupled to said logic "1" output node, a source (S) coupled to said power supply, a drain (D) coupled to said logic "1" output node;

a first N-channel metal oxide semiconductor (NMOS) transistor with a gate coupled to said logic "1" output node, a source (S) coupled to a ground (GND), a drain (D) coupled to said logic "0" output node.

2. The constant output circuit of claim 1, further comprising:
   a second N-channel metal oxide semiconductor (NMOS) transistor with a gate coupled to said first output node, a source (S) coupled to a ground (GND), a drain (D) coupled to said logic "0" output node.

3. The constant output circuit of claim 1, wherein said logic circuit is an inverter gate.

4. The constant output circuit of claim 3 wherein said inverter gate is a N-channel metal oxide semiconductor (NMOS) inverter gate.

5. The constant output circuit of claim 3 wherein said inverter gate is a complementary metal oxide semiconductor (CMOS) inverter gate.

6. A constant output circuit having a logic "1" output node and a logic "0" output node, comprising:
   a logic circuit having a first input node and a first output node for logical inversion operation, said first input node being coupled to said logic "0" output node;
   a first N-channel metal oxide semiconductor (NMOS) transistor with a gate (G) coupled to said first output node, a source (S) coupled to a ground (GND), a drain (D) coupled to said logic "0" output node;
   a second NMOS transistor with a gate coupled to said logic "0" output node, a source (S) coupled to said ground, a drain (D) coupled to said logic "0" output node;
   a first P-channel metal oxide semiconductor (PMOS) transistor with a gate coupled to said logic "0" output node, a source (S) coupled to a power supply (VDD), a drain (D) coupled to said logic "1" output node.

7. The constant output circuit of claim 6 further comprising:
   a second P-channel metal oxide semiconductor (PMOS) transistor with a gate coupled to said first output node, a source (S) coupled to a power supply (VDD), a drain (D) coupled to said logic "1" output node.

8. The constant output circuit of claim 6, wherein said logic circuit is an inverter gate.

9. The constant output circuit of claim 8 wherein said inverter gate is a N-channel metal oxide semiconductor (NMOS) inverter gate.

10. The constant output circuit of claim 8 wherein said inverter gate is a complementary metal oxide semiconductor (CMOS) inverter gate.

* * * * *